United States Patent
Fan et al.

(10) Patent No.: US 10,877,080 B2
(45) Date of Patent: Dec. 29, 2020

(54) SECURITY METHOD FOR MONITORING AN OPTICAL MODULE AND THREE-DIMENSIONAL SENSOR USING THE SAME

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); GENERAL INTERFACE SOLUTION LIMITED, Miaoli County (TW)

(72) Inventors: Chia-Ming Fan, Shenzhen (CN); Ying Long Ye, Shenzhen (CN)

(73) Assignees: Interface Technology (Chengdu) Co., Ltd., Sichuan (CN); Interface Optoelectronics (Shenzhen) Co., Ltd., Guangdong (CN); General Interface Solutions Limited, Miaoli County (TW)

( * ) Notice: Subject to any disclaimer, the term of this patent is extended or adjusted under 35 U.S.C. 154(b) by 168 days.

(21) Appl. No.: 16/352,099

(22) Filed: Mar. 13, 2019

(65) Prior Publication Data
US 2020/0256906 A1    Aug. 13, 2020

(30) Foreign Application Priority Data

Feb. 13, 2019  (CN) .......................... 2019 1 0112988

(51) Int. Cl.
*H01F 30/12*  (2006.01)
*G01R 27/26*  (2006.01)
(Continued)

(52) U.S. Cl.
CPC .......... *G01R 27/2611* (2013.01); *G01R 13/00* (2013.01); *G01R 15/181* (2013.01);
(Continued)

(58) Field of Classification Search
CPC ...... G01R 23/02; G01R 23/00; G01R 15/181; G01R 19/20; G01R 23/09; G01R 13/00;
(Continued)

(56) References Cited

U.S. PATENT DOCUMENTS

| | | | |
|---|---|---|---|
| 2009/0085560 A1* | 4/2009 | Rollins | H03K 17/9505 324/207.26 |
| 2014/0285468 A1* | 9/2014 | Liao | G06F 3/044 345/174 |
| 2015/0054355 A1* | 2/2015 | Ben-Shalom | G05B 13/0205 307/104 |

\* cited by examiner

*Primary Examiner* — Raul J Rios Russo
(74) *Attorney, Agent, or Firm* — Rosenberg, Klein & Lee

(57) ABSTRACT

A security method for monitoring an optical module and a three-dimensional sensor using the same apply electromagnetic induction to the three-dimensional sensor to monitor the optical module and a light source module. Two inductive coils corresponding to each other are arranged on the light source module and the optical module. An alternative current is inputted to one of the inductive coils and another of the inductive coils generates an inductive current. The value of the inductive current is continuously detected. When the value of the inductive current varies, the abnormality of the optical module is determined to shut down the light source module, thereby completing the security mechanism of the three-dimensional sensor.

10 Claims, 6 Drawing Sheets

(51) Int. Cl.
*G06K 9/00* (2006.01)
*G01R 23/02* (2006.01)
*G01R 23/00* (2006.01)
*G01R 15/18* (2006.01)
*G01R 19/20* (2006.01)
*G01R 23/09* (2006.01)
*G01R 13/00* (2006.01)
G01R 15/14 (2006.01)
G01R 15/16 (2006.01)

(52) U.S. Cl.
CPC .............. *G01R 19/20* (2013.01); *G01R 23/00* (2013.01); *G01R 23/02* (2013.01); *G01R 23/09* (2013.01); *G06K 9/0004* (2013.01); *G06K 9/00221* (2013.01); G01R 15/142 (2013.01); G01R 15/16 (2013.01)

(58) Field of Classification Search
CPC .. G01R 15/142; G01R 15/16; G01R 27/2611; G06K 9/0004; G06K 9/00221; G06K 9/00255; H01S 5/06825
USPC ..................... 324/72, 76.11–76.83, 160, 200
See application file for complete search history.

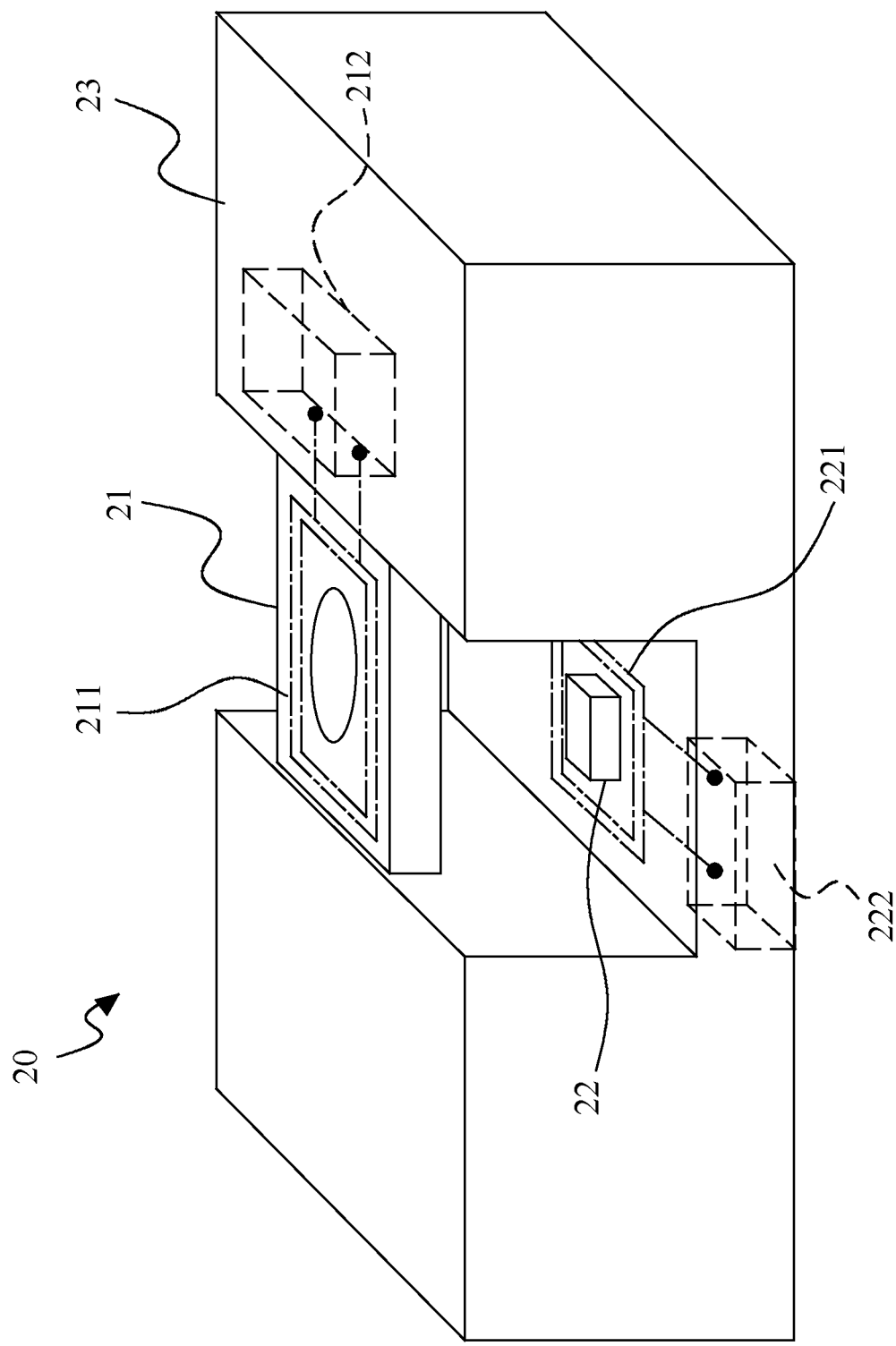

SECURITY METHOD FOR MONITORING AN OPTICAL MODULE AND THREE-DIMENSIONAL SENSOR USING THE SAME

This application claims priority for China patent application no. 201910112988.3 filed on Feb. 13, 2019, the content of which is incorporated by reference in its entirety.

BACKGROUND OF THE INVENTION

Field of the Invention

The present invention relates to a security method for monitoring an optical module applied to a three-dimensional sensor, particularly to a security method for monitoring an optical module and a three-dimensional sensor using the same, which adopt magnetic induction to achieve the security purpose.

Description of the Related Art

As mobile phone manufacturers use three-dimensional (3D) sensors to perform functions such as face recognition and unlocking, the demand for three-dimensional sensors is increasing. In the market, a three-dimensional sensor 10 is composed of an optical module 11, a light source module 12, and a modular stand 13, as shown in FIG. 1. In the three-dimensional sensor 10, the light source module 12 uses laser light since the laser light has good collimation and good coherence. When the laser light passes through the optical module 11, the optical module 11 diffracts the laser light to form diffraction spots with good quality. One of the applications of the three-dimensional sensor 10 is in face recognition. Thus, the energy of the laser has not to be too large lest human eyes be injured when the laser is used to scan a face. In design, the laser light passes through the optical module 11 to form diffraction spots that have to comply with safety regulations. Every time the optical module 12 starts to operate guaranteeing to normally assemble the light source module 12 and the optical module 11 is a very important security monitoring mechanism.

When the three-dimensional sensor is used, the abnormality of the optical module is classified into two situations. (a) The optical module falls off, such that the optical module directly emits the laser light rather than dissipates the energy of the laser light. Thus, the emitted laser light has large energy and injures human eyes at the risk of huge compensation. (b) The optical module shifts such that the laser light does not from diffraction spots according to the design value. Thus, the diffraction spot may has energy larger than the design value and injure human eyes.

To overcome the abovementioned problems, the present invention provides a mechanism to determine whether the optical module and the light source module have abnormalities when using the three-dimensional sensor, so as to solve the afore-mentioned problems of the prior art.

SUMMARY OF THE INVENTION

The primary objective of the present invention is to provide a security method for monitoring an optical module and a three-dimensional sensor using the same, which apply magnetic induction to the three-dimensional sensor and detect the value of an inductive current corresponding to a light source module and an optical module to continuously determine whether the two modules normally operate, thereby achieving the security purpose.

To achieve the abovementioned objectives, the present invention provides a security method for monitoring an optical module, applied to a three-dimensional sensor including the optical module and a light source module opposite to each other, comprising: arranging at least one first inductive coil on the optical module and correspondingly arranging at least one second inductive coil on the light source module; inputting an alternative current to one of the at least one first inductive coil and the at least one second inductive coil and driving another of the at least one first inductive coil and the at least one second inductive coil to generate an inductive current; and continuing with detecting a value of the inductive current and determining whether an abnormality of the optical module occurs according to the variation of the value of the inductive current.

In an embodiment of the present invention, the step of continuing with detecting the value of the inductive current and determining whether the abnormality of the optical module occurs according to the variation of the value of the inductive current further comprises: detecting an initial value of the inductive current; detecting a working value of the inductive current; and determining that the abnormality of the optical module occurs when the working value is zero or less than the initial value.

In an embodiment of the present invention, the abnormality comprises a falling off event, a shifting event, a breaking event, and a destroying event.

In an embodiment of the present invention, a security mechanism starts when the abnormality of the optical module occurs.

In an embodiment of the present invention, the light source module is shut down when the security mechanism starts.

The present invention also provides a three-dimensional sensor using the security method for monitoring the optical module, and the three-dimensional sensor comprising: an optical module; a light source module arranged opposite to the optical module and configured to emit a light source to the optical module; at least one first inductive coil arranged on the optical module; and at least one second inductive coil, arranged on the light source module, corresponding to the at least one first inductive coil; wherein one of the at least one first inductive coil and the at least one second inductive coil receives an alternative current and another of the at least one first inductive coil and the at least one second inductive coil generates an inductive current for detection, thereby completing a security mechanism for monitoring the optical module.

In an embodiment of the present invention, one of the at least one first inductive coil and the at least one second inductive coil is coupled to an external power supply or a current providing circuit of the light source module, and the alternative current is provided by the external power supply or the current providing circuit.

In an embodiment of the present invention, the three-dimensional sensor further comprises a current detector coupled to one of the at least one first inductive coil and the at least one second inductive coil generating the inductive current and configured to detect the value of the inductive current.

In an embodiment of the present invention, each of the at least one first inductive coil and the at least one second inductive coil is fixed to the optical module or the light source module using at least one fixing element or an adhesive.

In an embodiment of the present invention, the material of the first inductive coil and the second inductive coil is selected from a group of consisting of gold, silver, copper, and copper alloy.

The present invention provides a security method for monitoring an optical module and a three-dimensional sensor using the same, which apply magnetic induction to the three-dimensional sensor. The value of the inductive current varies when the positions of the optical module and the light source module or the distance between the modules varies. As a result, the value of the inductive current is monitored to determine whether the two modules move by each other, thereby starting the security mechanism and guaranteeing that the light source module is normally assembled with the optical module. Thus, the energy of the light source complies with safety regulations to avoid injuring human eyes.

Below, the embodiments are described in detail in cooperation with the drawings to make easily understood the technical contents, characteristics and accomplishments of the present invention.

BRIEF DESCRIPTION OF THE DRAWINGS

FIG. 3 is a diagram schematically showing a three-dimensional sensor according to an embodiment of the present invention;

DETAILED DESCRIPTION OF THE INVENTION

Figure 1:
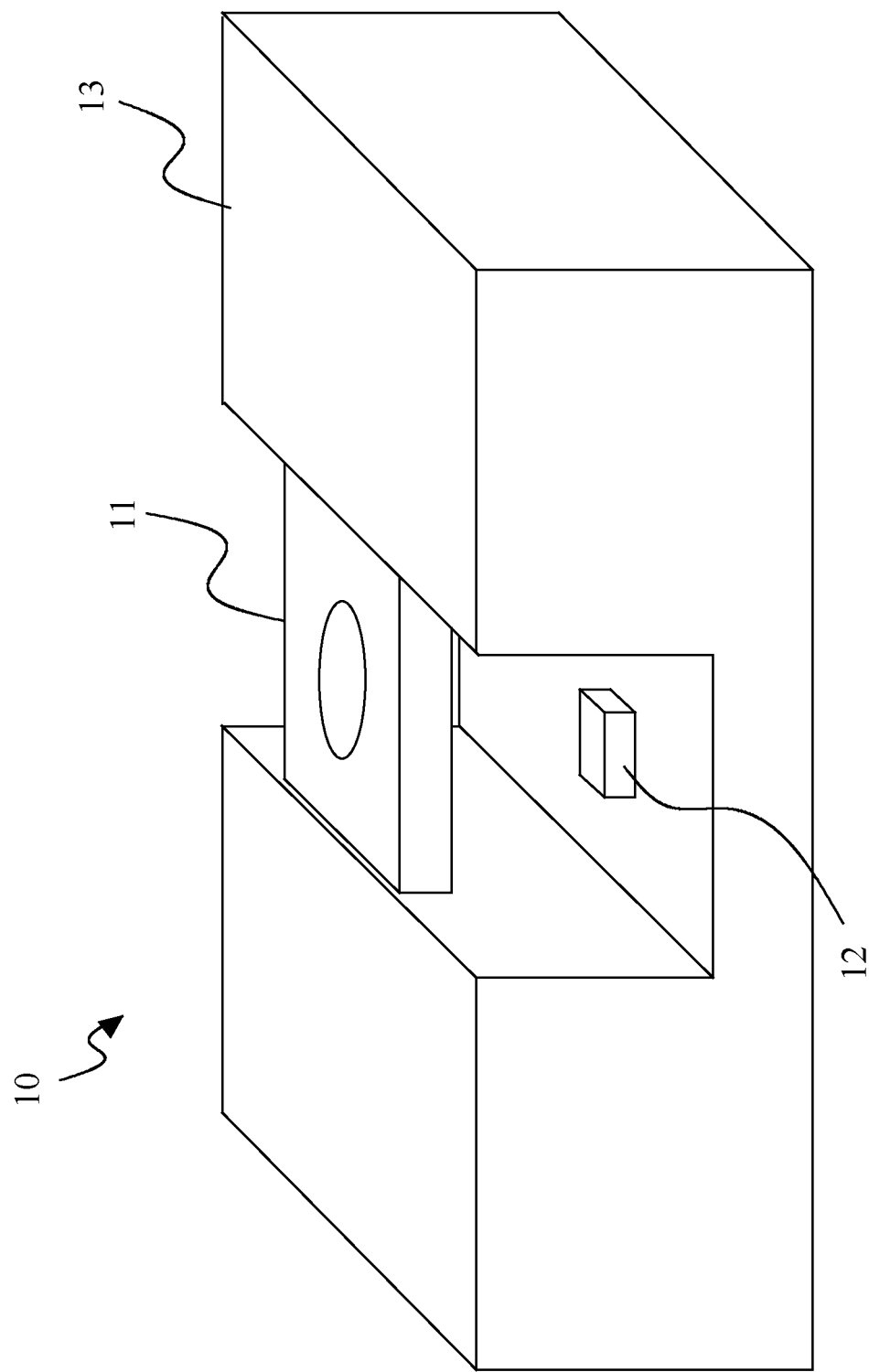
FIG. 1 is a diagram schematically showing a three-dimensional sensor in the conventional technology.
Figure 2:
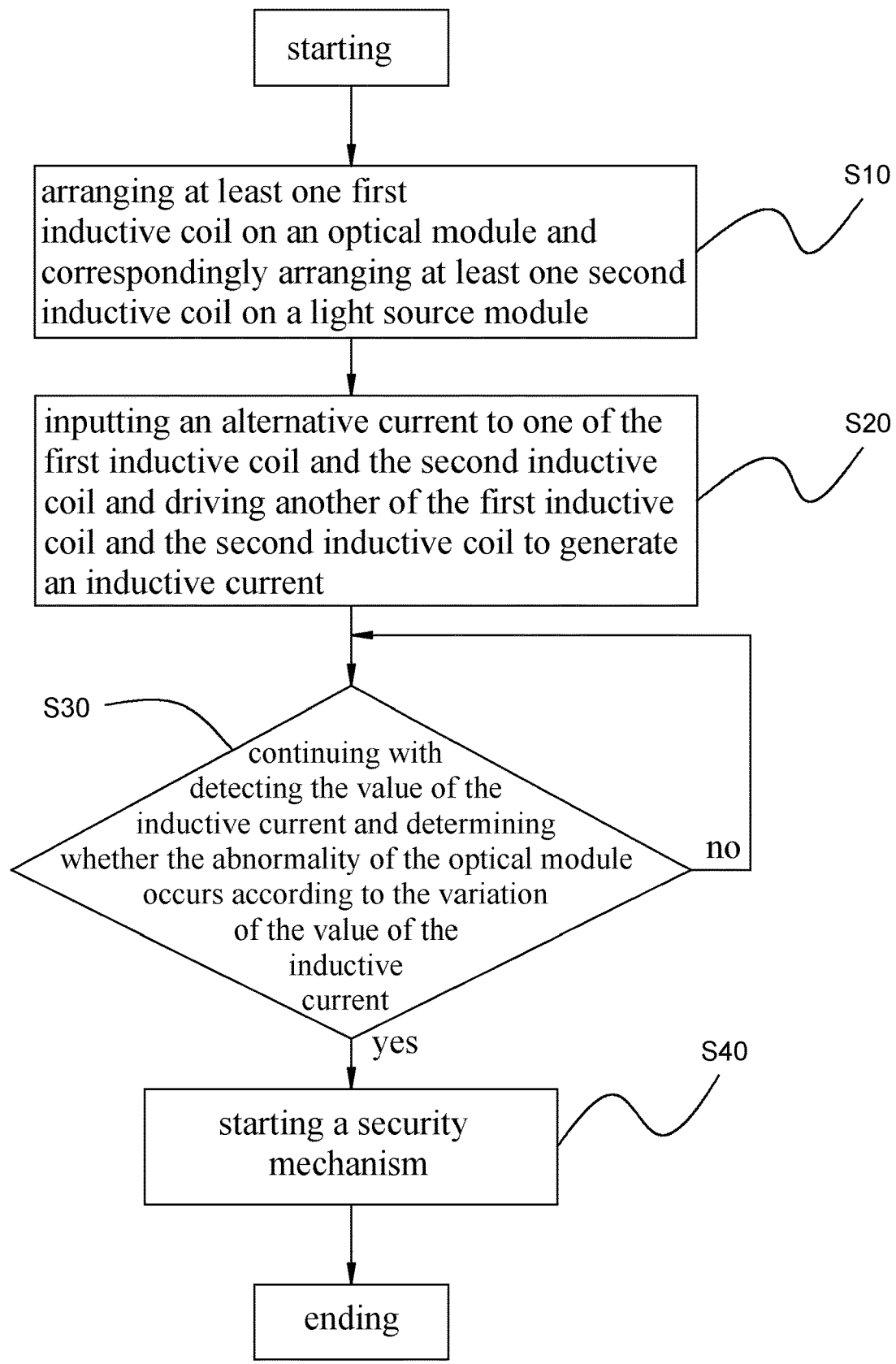
FIG. 2 is a flowchart of a security method for monitoring an optical module according to an embodiment of the present invention.

Refer to FIG. 2 and FIG. 3. FIG. 2 is a flowchart of a security method for monitoring an optical module according to an embodiment of the present invention. FIG. 3 is a diagram schematically showing a three-dimensional sensor 20 according to an embodiment of the present invention. The three-dimensional sensor 20 comprises a modular stand 23, an optical module 21, and a light source module 22, wherein the optical module 21 and the light source module 22 are arranged opposite to each other. The light source module 22 is configured to emit a light source to the optical module 21. The optical module 21 diffracts the light source to form diffraction spots. The optical module 21 is provided with one or more first inductive coils 211. The light source module 22 is provided with one or more second inductive coils 221. The first inductive coil 211 corresponds to the second inductive coil 221 (described as follows). The security method for monitoring the optical module 21 comprises the following steps.

Firstly, in Step S10, at least one first inductive coil 211 is arranged on the optical module 21 and at least one second inductive coil 221 is correspondingly arranged on the light source module 22.

In the embodiment, the first inductive coil 211 and the second inductive coil 221 are respectively formed in the optical module 21 and the light source module 22. Alternatively, the first inductive coil 211 and the second inductive coil 221 are respectively assembled with the optical module 21 and the light source module 22. The material of the first inductive coil 211 and the second inductive coil 221 is selected from a group of consisting of gold, silver, copper, and copper alloy.

In step S20, an alternative current is inputted to one of the first inductive coil 211 and the second inductive coil 221 to establish a stably-varying magnetic field in space and another of the first inductive coil and the second inductive coil is driven to generate an inductive current.

Wherein, one of the first inductive coil 211 and the second inductive coil 221 is coupled to an external power supply 222 or the current providing circuit of the light source module 22, and the alternative current is provided by the external power supply 222 or the current providing circuit.

Then, in Step S30, the value of the inductive current is continuously detected to determine whether the abnormality of the optical module 21 occurs according to the variation of the value of the inductive current.

In Step S30, the initial value of the inductive current is detected, the working value of the inductive current is detected, and the process determines that the abnormality of the optical module 21 occurs when the working value is zero or less than the initial value. The abnormality comprises a falling off event, a shifting event, a breaking event, and a destroying event. One of the first inductive coil 211 and the second inductive coil 221 generating the inductive current (the inductive coil having no alternative current) is coupled to a current detector 212, and the value of the inductive current is detected by the current detector 212. For example, if the alternative current is inputted to the second inductive coil 221, the first inductive coil 211 generates the inductive current. Thus, the current detector 212 is coupled to the first inductive coil 211, and the value of the inductive current is detected by the current detector 212.

Finally, in Step S40, a security mechanism starts when the abnormality of the optical module 21 occurs. Specifically, the light source module 22 is directly shut down when the security mechanism starts.

In Step S30, the value of the inductive current is continuously detected and monitored such that the light source module 22 normally operates when the abnormality of the optical module 21 does not occur.

The technical principle used by the present invention is introduced as follows. According to the technical principle, the inductive current corresponding to the light source module 22 and the optical module 21 is generated. The value of the inductive current varies when the positions of the optical module and the light source module or the distance between the modules varies. As a result, the two modules are monitored by monitoring the value of the inductive current. The inductive current is generated based on Faraday's law of electromagnetic induction. Faraday's law states that there is electromotive force (EMF) on the conductive loop when the magnetic flux through the surface enclosed by the loop varies in time. That is to say, there is stable electromotive force (EMF) on the conductive loop when the magnetic flux through the surface enclosed by the loop stably varies in time.

The formula (I) of the inductive current is described as follows:

$$I=\varepsilon/R=[N*A*B*\sin(\omega t)]/R \qquad (I);$$

Wherein, I: inductive current;
A: area of coil;
B*sin(ωt): variation of magnetic field in time;
N: turns of coil; and
R: inner resistance of inductive coil.

Figure 4A:
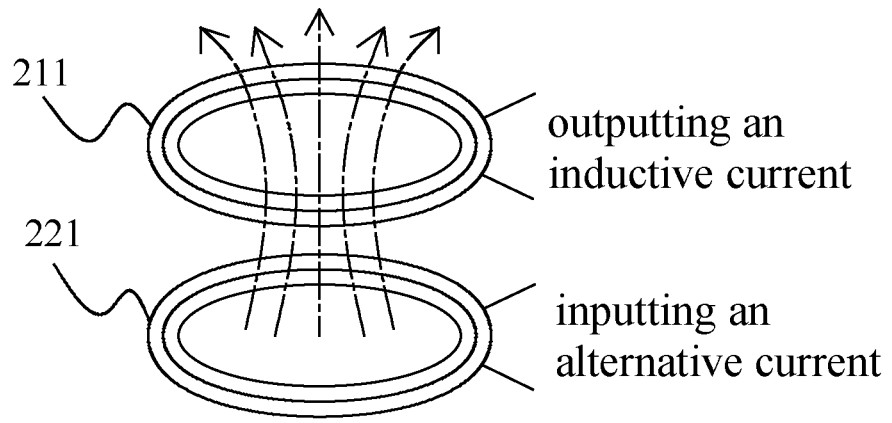
FIG. 4A is a diagram schematically showing a first inductive coil and a second inductive coil generating an inductive current according to an embodiment of the present invention.

Refer to FIG. 4A. Based on electromagnetic induction, it is known that the alternative current is inputted to the inductive coil 221 to establish a stably-varying magnetic field and the inductive coil 211 generates the inductive current. The amount of the inductive current is positive correlated with the positions and turns of the inductive coils 221 and 211 and the distance between the inductive coils 221 and 211.

The present invention applies electromagnetic induction to the three-dimensional sensor to build up the security mechanism for monitoring the light source module and the optical module. Two inductive coils corresponding to each other are arranged on the light source module and the optical module. The alternative current is inputted to one of the inductive coils to establish a stably-varying magnetic field in space and another of the inductive coils generates the inductive current, whereby the value of the inductive current is continuously detected. As shown in FIG. 3, the first inductive coil 211 and the second inductive coil 221 are arranged in the three-dimensional sensor 20. The value of the inductive current generated by the first inductive coil 211 is decreased when the optical module 21 falls off, shifts, breaks, or destroys. As soon as the value of the inductive current is decreased, the light source module 22 is powered off to complete the security mechanism.

Figure 4B:
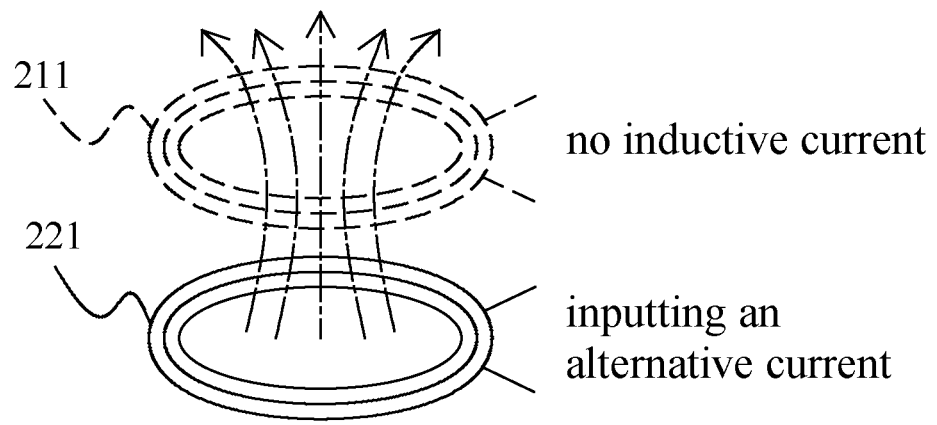
FIG. 4B and FIG. 4C are diagrams schematically showing that the value of an inductive current generated by a first inductive coil and a second inductive coil varies when the abnormality of an optical module occurs according to an embodiment of the present invention.
Figure 4C:
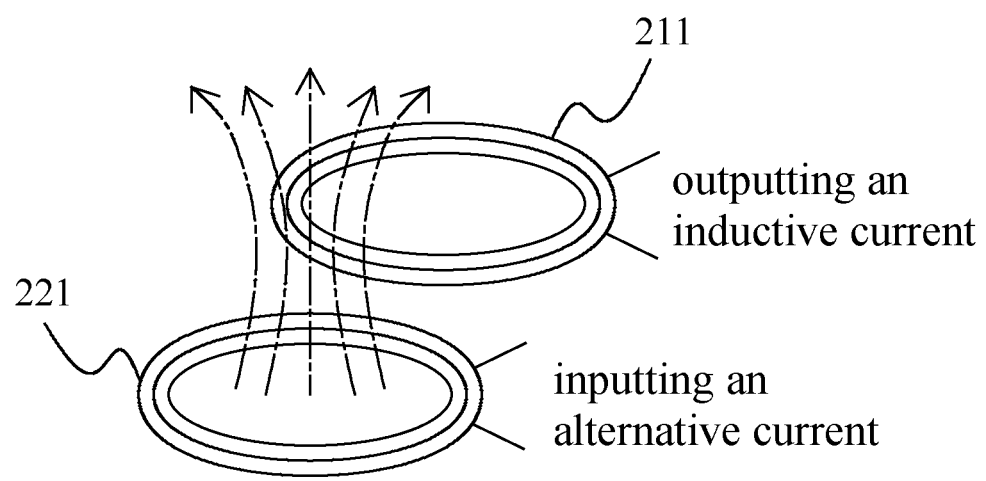

FIG. 4B and FIG. 4C show that the optical module falls off or shifts. The method of the present invention is used to monitor the abnormality of the optical module. When the first inductive coil 211 falls off (as shown in FIG. 4B), no inductive current (the value of the inductive current is zero) is detected. When the first inductive coil 211 shifts (as shown in FIG. 4B), the inductive current that is detected is decreased (the initial value of the working value of the inductive current are different), thereby powering off the light source module and completing the security mechanism of the three-dimensional sensor.

Figure 5A:
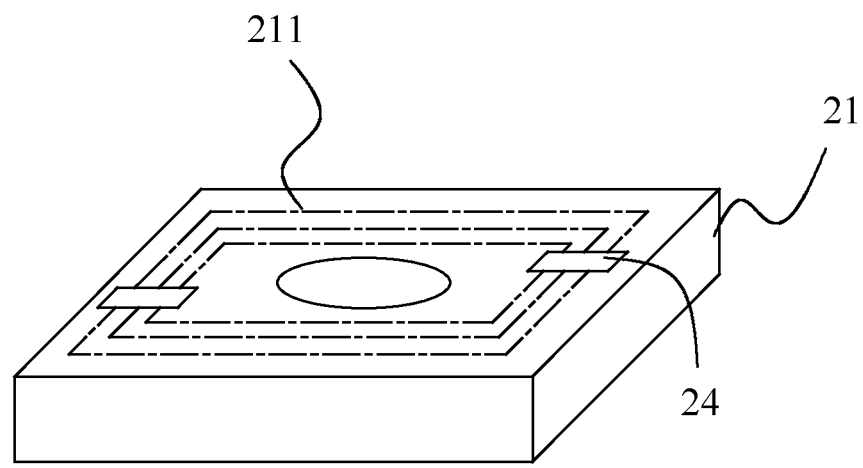
FIG. 5A is a diagram showing that a first inductive coil is fixed using a fixing element according to an embodiment of the present invention.
Figure 5B:
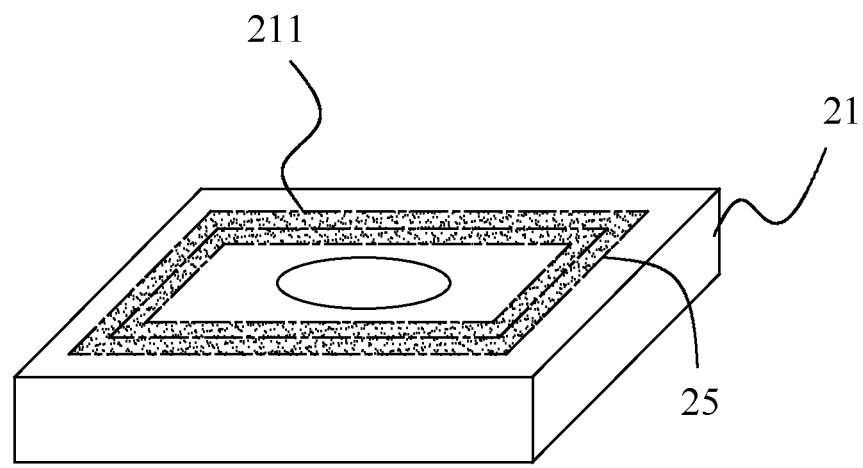
FIG. 5B is a diagram showing that a first inductive coil is fixed using a adhesive according to an embodiment of the present invention according to an embodiment of the present invention.

For the way of installing the inductive coils on the optical module and the light source module, one first inductive coil 211 is taken as an example. As shown in FIG. 5A, the first inductive coil 211 is fixed to the optical module 21 using a fixing element 24 such as a screw. Alternatively, the first inductive coil 211 is fixed to the optical module 21 using an adhesive 25, as shown in FIG. 5B. Similarly, the second inductive coil is fixed to the light source module using a fixing element 24 such as a screw. Alternatively, the second inductive coil is fixed to the light source module using an adhesive 25.

In conclusion, the present invention provides a security method for monitoring an optical module and a three-dimensional sensor using the same, which apply electromagnetic induction to the three-dimensional sensor, arrange two or more inductive coils on the light source module and the optical module, and detect the variation of the value of the inductive current corresponding to the light source module and the optical module to determine whether the optical module is normally assembled with the light source module, thereby starting the security mechanism. This way, the high-energy light source is guaranteed to from diffraction spots with good quality after a diffraction process without injuring human eyes. The method of the present invention is suitable for an optical lens module and a depth sensor module.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A security method for monitoring an optical module, applied to a three-dimensional sensor including the optical module and a light source module opposite to each other, comprising:
   arranging at least one first inductive coil on the optical module and correspondingly arranging at least one second inductive coil on the light source module;
   inputting an alternative current to one of the at least one first inductive coil and the at least one second inductive coil and driving another of the at least one first inductive coil and the at least one second inductive coil to generate an inductive current; and
   continuing with detecting a value of the inductive current and determining whether an abnormality of the optical module occurs according to a variation of the value of the inductive current.

2. The security method for monitoring the optical module according to claim 1, wherein the step of continuing with detecting the value of the inductive current and determining whether the abnormality of the optical module occurs according to the variation of the value of the inductive current further comprises:
   detecting an initial value of the inductive current;
   detecting a working value of the inductive current; and
   determining that the abnormality of the optical module occurs when the working value is zero or less than the initial value.

3. The security method for monitoring the optical module according to claim 2, wherein a security mechanism starts when the abnormality of the optical module occurs.

4. The security method for monitoring the optical module according to claim 3, wherein the light source module is shut down when the security mechanism starts.

5. The security method for monitoring the optical module according to claim 1, wherein one of the at least one first inductive coil and the at least one second inductive coil is coupled to an external power supply or a current providing circuit of the light source module, and the alternative current is provided by the external power supply or the current providing circuit.

6. The security method for monitoring the optical module according to claim 1, wherein one of the at least one first inductive coil and the at least one second inductive coil generating the inductive current is coupled to a current detector, and the value of the inductive current is detected by the current detector.

7. The security method for monitoring the optical module according to claim 1, wherein each of the at least one first inductive coil and the at least one second inductive coil is fixed to the optical module or the light source module using at least one fixing element or an adhesive.

8. A three-dimensional sensor comprising:
   an optical module;

a light source module arranged opposite to the optical module and configured to emit a light source to the optical module;
at least one first inductive coil arranged on the optical module; and
at least one second inductive coil, arranged on the light source module, corresponding to the at least one first inductive coil;
wherein one of the at least one first inductive coil and the at least one second inductive coil receives an alternative current and another of the at least one first inductive coil and the at least one second inductive coil generates an inductive current for detection.

9. The three-dimensional sensor according to claim 8, wherein one of the at least one first inductive coil and the at least one second inductive coil is coupled to an external power supply or a current providing circuit of the light source module, and the alternative current is provided by the external power supply or the current providing circuit.

10. The three-dimensional sensor according to claim 8, further comprising a current detector coupled to one of the at least one first inductive coil and the at least one second inductive coil generating the inductive current and configured to detect the value of the inductive current.

* * * * *